United States Patent [19]

Horninger

[11] 4,030,081
[45] June 14, 1977

[54] DYNAMIC TRANSISTOR-STORAGE ELEMENT

[75] Inventor: Karlheinrich Horninger, Eglharting, Germany

[73] Assignee: Siemens Aktiengesellschaft, Berlin & Munich, Germany

[22] Filed: Sept. 2, 1975

[21] Appl. No.: 609,622

[30] Foreign Application Priority Data

| Sept. 3, 9174 | Germany | 2442134 |
| Sept. 3, 1974 | Germany | 2442133 |
| Sept. 3, 1974 | Germany | 2442132 |
| Sept. 3, 1974 | Germany | 2442131 |

[52] U.S. Cl. .................. 340/173 CA; 307/238; 307/304; 340/173 R
[51] Int. Cl.² ............... G11C 11/24; H03K 5/00; H03K 3/353
[58] Field of Search ... 340/173 R, 173 CA, 173 FF; 307/238, 246, 304

[56] References Cited

UNITED STATES PATENTS

| 3,706,079 | 12/1972 | Vadasz et al. | 340/173 CA |
| 3,876,991 | 4/1975 | Nelson et al. | 340/173 R |
| 3,876,993 | 4/1975 | Cavanaugh | 340/173 CA |
| 3,893,086 | 7/1975 | Nanya | 340/173 R |

*Primary Examiner*—Daryl W. Cook
*Attorney, Agent, or Firm*—Hill, Gross, Simpson, Van Santen, Steadman, Chiara & Simpson

[57] ABSTRACT

A dynamic storage element is characterized in that, in addition to the transistors of the storage element, at least one $MI_1I_2S$ storage transistor is provided to receive the data stored in the storage element. The dynamic storage element comprises a transistor and a series-connected capacitor. The transistor is connected on the one hand to the capacitor and on the other hand to a bit line, and the gate terminal of the transistor is connected to a word line. In particular, a $MI_1I_2S$ storage transistor is additionally provided which is connected on the one hand to the word line and on the other hand to a point at which the transistor and the capacitor are connected in series and the gate terminal of the $MI_1I_2S$ storage transistor is connected to a gate line.

28 Claims, 4 Drawing Figures

DYNAMIC TRANSISTOR-STORAGE ELEMENT

BACKGROUND OF THE INVENTION

1. Field of the Invention

This invention relates to a dynamic transistor storage element of the type in which, in addition to the transistors of the storage element, at least one $MI_1I_2S$ storage transistor is provided for receiving the data stored in the storage element.

2. Description of the Prior Art

Dynamic transistor storage elements are known in the art. For example, the German published application No. 2,148,896 describes, among other things, a one-transistor storage element which comprises a capacitor and a field effect transistor. For reading out data from a one-transistor storage element, the transistor of the storage element, which is connected on the one hand to the bit line and on the other hand to a capacitor, is rendered conductive by way of its gate terminal which is connected to a selection line. This causes the data stored in the form of a charge in the storage capacitor to flow onto the bit line via the selected field effect transistor.

Dynamic storage elements are also known in the art which have three transistors. For example, the publication "New 4,096-bit MOS Chip Is Heart Of Fast, Compact Computer Memory," Electronics, Dec. 18, 1972, Pages 97 et seq describes a storage element of this type.

The publication of L.W. Terman: "MOSFET Memory Circuits," Proceedings of the IEEE, Vol. 59, No. 7, July 1971, pp. 1044 to 1058 describes a four-transistor storage element. This is a dynamic storage element comprising two selection transistors and two switching transistors having feedback. In each case, one selection transistor is connected, on the one hand, to a bit line and, on the other hand, to a junction of the storage element. The selection transistors are commonly operable by way of a word line.

A disadvantage of such dynamic storage elements resides in the fact that the stored date must be regenerated at intervals of approximately 1 to 100 ms. A further disadvantage resides in the fact that when the supply voltage is disconnected, the data stored in the storage elements is lost.

SUMMARY OF THE INVENTION

Therefore, the primary object of the present invention is to provide a storage element, as mentioned in the introductory portion of this paper, in which the stored date can be stored for a longer period of time.

This object is realized with the provision of a storage element, as described generally in the foregoing, which is characterized by the feature that at least one $MI_1I_2S$ storage transistor is provided for receiving the data storage in the storage element.

An advantageous feature of a storage element constructed in accordance with the invention consisting that the mode of functioning of the dynamic one-transistor storage element is not disturbed in normal operation by the $MI_1I_2S$ transistor which is additionally connected, in accordance with the invention, and that the date is only restored into the $MI_1I_2S$ transistor in the event of long storage periods.

Advantageously, the date input in this manner into the $MI_1I_2S$ transistors can be stored for a long period of time which can be extended up to ten years.

In accordance with another advantage of the invention, data can be written-in by elements, by rows, or also in matrix form.

Advantageously, the data can be erased row-by-row, in which case the date can be intermediately stored in the regenerator amplifiers.

BRIEF DESCRIPTION OF THE DRAWINGS

Other objects, features and advantages of the invention, it organization, construction and operation, will be best understood from the following detailed description, taken in conjunction with the accompanying drawings, on which.

DESCRIPTION OF THE PREFERRED EMBODIMENTS

Figure 1:
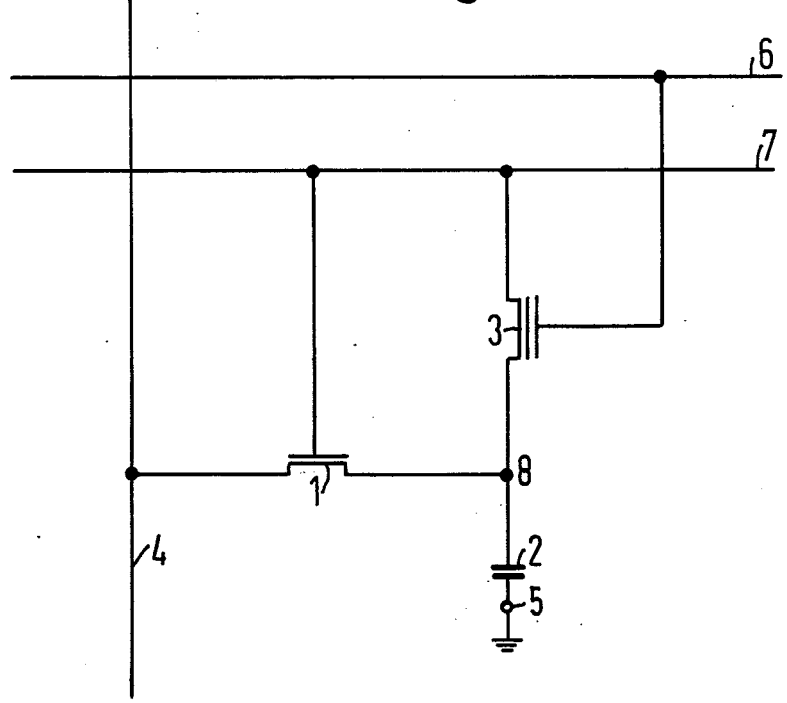
FIG. 1 is a schematic circuit diagram of a dynamic two-transistor storage element constructed in accordance with the invention.

Referring to FIG. 1, a transistor 1 of a two-transistor storage element is connected to a reference potential, here ground, by way of a capacitor 2. Preferably, the transistor 1 is a MOS field effect transistor. The transistor 1 is connected, at a point 8, to the capacitor 2 as illustrated in FIG. 1. The capacitor 2 is also connected to a terminal 5 which, as mentioned above, is preferably connected to ground. The gate terminal of the transistor 1 is connected to a word line 7. The transistor 1 is also connected to a bit line 4 as illustrated in FIG. 1.

In accordance with the invention, a $MI_1I_2S$ transistor 3, preferably a MNOS transistor, is connected between the junction 8 and the word line 7 in the manner illustrated, and the gate terminal of the MNOS storage transistor 3 is connected to a gate line 6.

In the following, the mode of operation of a dynamic two-transistor storage element constructed in accordance with the invention will be described. If, for example, the date 1 has been written into the storage element, the capacitor 2 is charged and the source terminal (the junction 8) of the MNOS storage transistor 3 carries a negative potential, e.g. approximately $-15$ V, and if, however, simultaneous to the write-in process, or just afterwards, a voltage $U_7$ of, e.g. approximately $-15$ V is connected to the word line 7, and a voltage pulse $U_6$ of, e.g. approximately $-30$ V is connected to the gate line 6, the threshold voltage of the MNOS storage transistor 3 is not shifted. If, on the other hand, a 0 is stored, the threshold voltage of the MNOS storage transistor 3 is displaced in the direction of negative voltage values, as during the write-in process the source terminal carries ground potential.

For reading out of information--assuming a p-channel MNOS storage transistor 3--a voltage $-U_7'$ of, e.g. approximately $-15$ V is connected to the word line 7, and a read-out voltage $-U_L$ of, e.g. approximately $-8$ V is connected to the gate line 6. If the MNOS storage transistor possesses a high negative threshold voltage, it is blocked and the capacitor 2 remains uncharged. If, on the other hand, the threshold voltage of the MNOS capacitor 3 is only slighly negative, it becomes conductive on the connection of a gate voltage of $-U_L$ and charges the capacitor 2 virtually to the voltage $-U_L$. Then, the voltage $-U_L$ likewise occurs on the bit line 4, since the transistor 1 is conductive. This voltage on the bit line 4 corresponds to a stored 1.

If the MNOS storage transistor 3 is not to be operated, the potential O V is connected to the gate line 6. Then, the MNOS storage transistor 3 advantageously has no influence on the normal operation of the dynamic one-transistor storage element.

When a n-channel MNOS transistor is employed as a storage transistor 3, and a switching transistor 1, for write-in and read-out of data, the corresponding potentials of the opposite polarity are connected to the gate line 6, and to the word line 7, and to the bit line 4.

Figure 2:
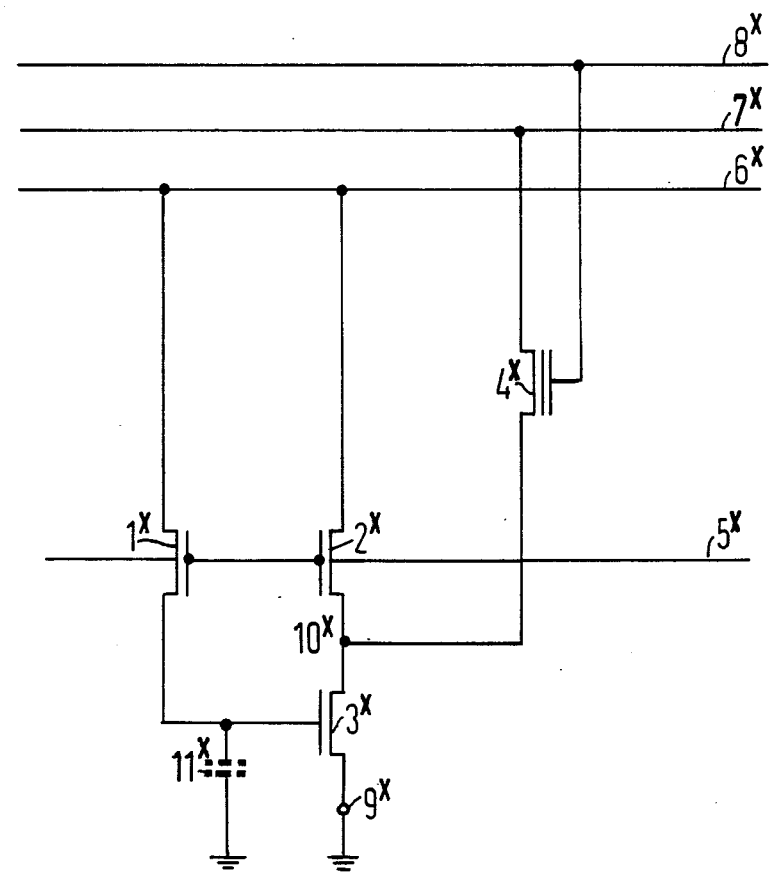
FIG. 2 is a schematic circuit diagram of a three-transistor storage element constructed in accordance with the invention.

In FIG. 2, the transistors 1*, 2* and 3* and a capacitor 11* form a dynamic three transistor storage element. Here, the transistors 2* and 3* are connected in series in the manner illustrated on the drawing and are located between a bit line 6* and a terminal 9*. Preferably, the terminal 9* carries ground potential. The transistor 1* is connected, on the one hand, to the bit line 6* and, on the other hand, to the gate terminal of the transistor 3*. The gate terminals of the transistors 1* and 2* are connected to each other. The gate terminals of the transistors 1* and 2* are connected to the bit line 5* which serves as a word line. In accordance with the invention, the MNOS storage transistor 4* is connected to the dynamic three transistor storage element in the manner illustrated on the drawing. Here, the MNOS storage transistor 4* is connected by its source terminal, in a manner illustrated, at a junction point 10* to the drain terminal of the transistor 3* to the source terminal of the transistor 2*. The drain terminal of the MNOS storage transistor 4* is connected to the read-out line 7* and the gate terminal of this MNOS switching transistor 4* is connected to the gate line 8*. Preferably, the voltage supply $U_{DD}$ is connected to the line 6* ($-10$ V).

In the following, the mode of operation of the dynamic three transistor storage element, in accordance with the invention, is explained. If a 1 is input into the capacitor 11* of the storage element, the transistor 3* is in the conductive state. This means that the source terminal of the transistor 4* carries the potential of the terminal 9*--preferably ground potential. When a 0 is stored, on the other hand, the transistor 3* blocks, which means that the source terminal of the MNOS storage transistor 4* is free of potential. If, now when a p-channel MNOS storage transistor 4* is employed, a negative voltage pulse is connected to the gate line 8* and to the read-out line 7*, when a 1 is stored the threshold voltage of the MNOS transistor 4* shifts towards negative voltage values, whereas when a 0 is stored, the threshold voltage of this transistor remains at its original value. This is due to the fact that when a 1 is stored, the full negative voltage is active across the gate of the MNOS storage transistor 4*, whereas this is not the case when a 0 is stored. Preferably, a negative voltage pulse of approximately $-30$ V/10 $\mu s$ is connected to the gate line 8* and to the read-out line 7*.

On read-out of dtat, data, when the data stored in the MNOS storage transistor 4* is to be read back into the dynamic three transistor storage element, the read-out line 7* is connected to ground potential, whereas the gate line 8* is connected to the read-out voltage $-U_L$.

In dependence upon the nature of the stored data, the bit line 6* is now connected, by way of the transistor 2* and by way of the MNOS transistor 4* to ground potential, or to supply voltage, when the storage transistor 4* blocks. In dependence upon whether the storage transistor 4* is conductive or is blocked, a read-out current either flows by way of the transistor 2* and via the storage element 4* onto the line 7*, or does not so flow.

When the data is restored out of the dynamic three transistor storage element into the MNOS storage transistor 4*, the data is inverted.

A further advantage is achieved in that the transistor 1* is designed as a MNOS transistor. However, the threshold voltage of the MNOS transistor 1* is to be made more negative than the threshold voltage of the transistor 2*, in order to prevent simultaneous write-in by way of the transistor 1* during read-out. Therefore, one does not require two different oxide thicknesses, as are required in the storage element described in the publication "New 4,096 bit MNOS Chip Is Heart Of Fast, Compact Computer Memory," Electronics, Dec. 18, 1972, Pages 97 to 103.

When a MNOS-n-channel transistor is employed as a storage transistor 4*, corresponding potentials of the opposite polarity are connected to the gate line 8* and to the read-out line 7* for write-in and read-out operations.

In a further development of the invention, the dynamic three transistor storage element can also be constructed in such a manner that the gate line of the transistors 1* and 2* are separately extracted. This has the advantage that these transistors can be operated separately during write-in and read-out operations.

An advantage of the three transistor storage element, in accordance with the invention, resides in the fact that its mode of operation is in no way disturbed by the MNOS transistor in accordance with the invention and that only in the event of long storage periods is the data restored into the MNOS storage transistor.

Figure 3:
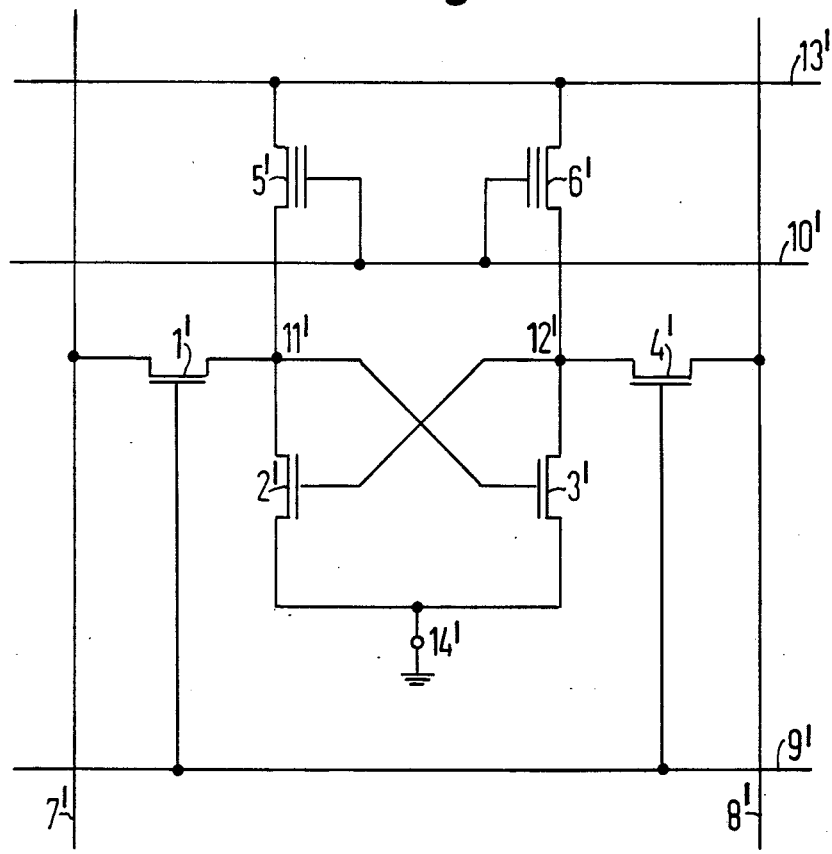
FIG. 3 is a schematic circuit diagram of a four-transistor storage element constructed in accordance with the invention.

In FIG. 3 of the drawings, the conventional dynamic four transistor storage element is formed from the transistors 1', 2', 3' and 4'. The transistors 1' and 4' represent the selection transistors. The transistor 1' is connected, on the one hand, to a bit line 7' and, on the other hand, to the junction point 11' of the storage element. Correspondingly, the transistor 4' is connected, on the one hand, to the junction point 12' of the storage element and, on the other hand, to the bit line 8'. The transistors 1' and 4' are commonly operable by way of a word line 9', and therefore, the gate terminals of these transistors are connected to the word line 9'. The transistors 2' and 3' represent the switching transistors of the dynamic storage element. The source zones of the transistors 2' and 3' are connected to the terminal 14'. A drain zone of the switching transistor 2' is connected to the junction point 11' of the flip-flop formed in this circuit and the drain zone of the transistor 3' is connected to the junction point 12' of this flip-flop. The gate terminal of the switching transistor 2' is connected to the junction point 12' of the storage element and the gate terminal of the switching transistor 3' is connected to the junction point 11' of the storage element.

Preferably, MOS transistors are employed as selection transistors for the transistors 1' and 4' and as the switching transistors 2' and 3'.

The MI₁I₂S transistors 5' and 6' illustrated in FIG. 3, which are preferably MNOS transistors, are additionally connected to the dynamic four transistor storage element in a manner illustrated on the drawing. On the one hand, the MNOS storage transistor 5' is connected to the junction 11' of the storage element and, on the other hand, to the line 13'. The MNOS storage transistor 6' is, on the other hand, connected to the junction point 12' of the storage element and, on the other hand, is also connected to the line 13'. The two MNOS storage transistors 5' and 6' are commonly operable by way of the gate line 10' and, therefore, their gate terminals are connected to the gate line 10'. Preferably, the source terminals of the switching transistors 2' and 3' which are connected to the terminal 14' are connected to ground potential.

The mode of operation of the process in accordance with the invention for the operation of a dynamic four-transistor storage element will now be described. Here, it has been assumed that initially the two MNOS storage transistors 5' and 6' each store a 0 which means that the start voltage of the two MNOS storage transistors 5' and 6'--assuming p-channel transistors---amounts to approximately −2V. Now, an item of date is to be written into the storage element by way of the bit lines 7' and 8'. For this purpose, first of all the two selection transistors 1' and 4' are rendered conductive by way of the word line 9'. This ensures that the item of data present on the bit lines 7' and 8' passes to the junction points 11' and 12' of the storage element. For example, this item of data causes the switching transistor 2' to be set into the conductive state and the switching transistor 3' into the blocking state. Now, in order to restore this data into the MNOS storage transistors, a high negative voltage pulse is connected to each of the lines 10' and 13'. For example, a voltage of −30 V is connected for approximately 10 μs. Since the source terminal of the MNOS storage transistor 5' is connected to ground potential by way of the conductive switching transistor 2', the full negative voltage is active across the gate and the threshold voltage of the MNOS storage transistor 5' is displaced in the direction of negative voltage values. For example, the threshold voltage of the MNOS storage transistor 5' then amounts to approximately −12 V. As the switching transistor 3' blocks, and therefore the source terminal of the MNOS storage transistor 6' carries no ground potential, the gate insulator of this transistor is connected to only a small voltage which is not sufficient to displace the threshold voltage of the MNOS storage transistor 6'. The data carried by the bit lines 7' and 8' has therefore been restored into the two MNOS storage transistors 5' and 6' through the connection of a high negative voltage pulse to the gate line 10' and to the line 13'.

In order that this item of data contained in the MNOS storage transistors 5' and 6' may be re-input into the dynamic four transistor storage element, the supply voltage of the storage circuit is connected to the line 13'. Preferably, this voltage amounts to approximately −20 V. At the same time, the other line 10' is connected to a read-out voltage −U_L having a value which corresponds approximately to the arithmetic mean of the two threshold voltages of the MNOS storage transistors 5' and 6'. This example is again based on the utilization of p-channel transistors. With this voltage −U_L the MNOS storage transistor 6' becomes conductive, whereas the MNOS storage transistor 5' is placed in a blocking condition. The switching transistor 2' is rendered conductive, via the conductive MNOS storage transistor 6', in that part of the potential of the line 13' reaches the gate terminal of the switching transistor 2'. As the MNOS storage transistor 5' is in a blocking condition, the switching transistor 3' is not rendered conductive. Therefore, the data is re-input into the dynamic storage element.

As a result of the connection of a positive potential of approximately +30 V to the gate line 10', the date written in the MNOS transistors is erased.

This process is explained in detail by G. Dorda and M. Pulver in the publication Tunnel Mechanism in MNOS Structures In Physics States Solid (a) 1, 71 (1970) Pages 71–79.

As previously explained above, the storage element constructed in accordance with the invention may also be employed as a static six transistor storage element. In this case, the two MNOS transistors 5' and 6' serve as load transistors of the flip-flop circuit. The transistors 2' and 3' represent switching transistors of the flip-flop circuit. The supply voltage −U_DD, which preferably amounts to approximately −30 V is present between the point 14' and the line 13'.

The erasure and write-in of data is effected in the manner described above in association with the dynamic four transistor storage element. This means that for the write-in of data, a negative potential of approximately and preferably −30 V is connected to the gate line 10', and that for the erasure of the data, a positive potential of, preferably and approximately +30 V is connected to the gate line 10'. During the read-out process, a potential of preferably and approximately −15 V is connected to the gate line 10'. This ensures that the flip-flop circuit triggers into the state which is impressed with the stored data.

The fact that the data stored in the MNOS transistors can disintegrate very rapidly when a dc voltage is connected to the gate electrodes is of no significance, since the magnitude of the start voltage of the MNOS transistors is of no further importance after the triggering of the flip-flop circuit.

When MNOS n-channel transistors are employed, the corresponding potentials of the opposite polarity are connected to the gate line 10' and to the line 13'.

Advantageously, two different items of data can be stored simultaneously in the storage element, in accordance with the invention, in which case one item data is stored in the MI₁I₂S storage transistor, whereas the other item of data is stored in the dynamic storage element.

Advantageously, the data stored in the four transistor storage element can be input into the MNOS transistors by virtue of one single pulse.

The mode of operation of the dynamic four transistor storage element in normal operation is advantageously not disturbed by the additionally connected MI₁I₂S transistors. The data is only restored into these MI₁I₂S transistors in the event of long storage periods.

Figure 4:
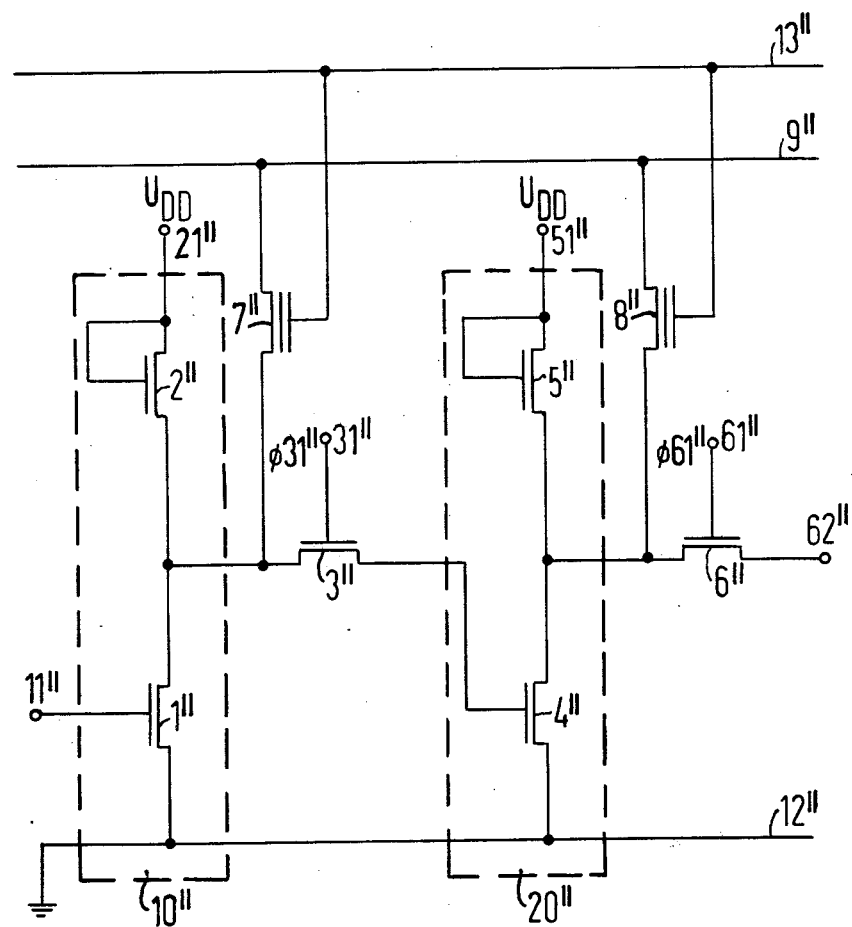
FIG. 4 is a schematic circuit diagram of a dynamic circuit diagram of a dynamic shift register constructed in accordance with the invention.

Referring to FIG. 4, the conventional, known dynamic shift register is formed by the transistor 1" to 6". The shift register basically comprises two inverters. The inverter 10" comprises the transistors 1" and 2" and the inverter 20" comprises the transistors 4" and 5". These inverters are connected in a manner illustrated in FIG. 4 via a transistor 3". By way of the line 12" and by way of the terminals 21" and 51" the supply voltage U_DD is connected to the inverters 10"

and 20". Preferably, the line 12" is connected to ground potential. The transistors 2" and 5" serve as load elements for the circuit. Preferably, the transistors 1" and 6" are MOS field effect transistors, the transistors 2" and 5" being connected in a known manner as static or dynamic load resistors.

The data passes by way of the terminal 11" into the first inverter 10" which comprises the transistors 1" and 2", and the data is advanced with the aid of a pulse train $\phi 31''$ which is connected to the terminal 31" of the transistor 3", to the second inverter 20" which comprises the transistors 4" and 5". From the latter circuit, the data is advanced to a terminal 62" by way of the transistor 6" which is pulsed by a pulse train $\phi 61''$ connected to the terminal 61". Additional inverters are connected to terminal 62" which forms the output of the shift register.

In accordance with the invention, MNOS storage transistors are additionally connected, in the manner illustrated in FIG. 4, to the known dynamic shift register. To the first inverter 10" a MNOS storage transistor 7" is connected in such a manner that its source terminal is connected to the source terminal of the transistor 3" and its drain terminal is connected to a line 9". The gate terminal of the MNOS storage transistor 7" is connected to a gate line 13". As illustrated in FIG. 4, the MNOS storage transistor 8" is connected to the second inverter 20" in such a manner that its source terminal is connected to the drain terminal of the transistor 6" and its drain terminal is connected to the line 9". The gate terminal of the MNOS storage transistor 8" is, in turn, connected to the gate line 13".

If, for example, the data 1 is input into the dyanmic storage element, the transistor 1" is rendered conductive by way of the terminal 11" which forms the input of the shift register. This ensures that the source terminal of the MNOS storage transistor 7" carries ground potential. If, on the other hand, the data 0 is input into the shift register, the transistor 1" is blocked by way of the terminal 11". This results in the fact that the source terminal of the MNOS storage transistor 7" carries the supply voltage potential $-U_{DD}$. When the data has been written into the shift register, in accordance with the invention, a voltage pulse is connected to the line 9" and to the gate line 13". Assuming the use of p-channel MNOS storage transistors, a single voltage--preferably and approximately $-30$ V--is connected for approximately 10 $\mu$s. In dependence upon whether the source terminal of the MNOS storage transistor 7" is connected to ground potential, or to the potential of the supply voltage, either the threshold voltage of this MNOS transistor is displaced toward a negative value, or is not so displaced.

On read-out of information, as a result of the connection of the read-out voltage $-U_L$ to the gate line 13", the data from the MNOS transistor 7" is re-input into the shift register. In this case, the supply voltage $-U_{DD}$ is connected to the line 9". During this operation, the data stored in the shift register is inverted.

When the pulse train $\phi 31''$ has caused the data to pass by way of the transistor 3" to the second storage element, the foregoing statements in respect of the MNOS storage transistor 7" also apply to the MNOS storage transistor 8".

When n-channel MNOS transistors are employed, for the write-in and read-out of data the corresponding potentials of the opposite polarity are connected to the line 9" and to the gate line 13".

Advantageously, it is also possible to utilize quite generally $MI_1I_2S$ transistors instead of the MNOS storage transistors. Preferably, one employs MNOS transistors having a dielectric which consists of a $SiO_2$ layer having a thickness of approximately 1 to 3 nm and of a $Si_3N_4$ layer having a thickness of approximately 30 to 60 nm.

The data stored in the dynamic shift register is advantageously input into the MNOS storage transistors in accordance with the invention by one single pulse.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A dynamic storage element, comprising: at least one transistor; at least one $MI_1I_2S$ storage transistor connected to receive data to be stored in said data storage transistor; a word line; a bit line; a gate line; and a capacitor, said one transistor comprising a first electrode connected to said capacitor, a second electrode connected to said bit line and a gate electrode connected to said word line, and said $MI_1I_2S$ storage transistor comprising a first electrode connected to said word line, a second electrode connected to the junction of said one transistor and said capacitor, and a gate electrode connected to said gate line.

2. A dynamic storage element according to claim 1, wherein said one transistor is a MOS field effect transistor.

3. A dynamic storage element according to claim 1, wherein said $MI_1I_2S$ transistor is a MNOS transistor.

4. A dynamic storage element, comprising: at least one $MI_1I_2S$ storage transistor connected to receive data to be stored in said data storage transistor; a read-out line; a bit line; a gate line; and three other transistors, each of said other transistors including a drain, a source and a gate with the source of a first of the transistors connected to the drain of a second of the transistors, said source of said second transistor connected to a reference potential, said drains of said first and third transistors connected to said bit line, said source of said third transistor connected to said gate of said second transistor, said gates of said first and third transistors constituting at least one work line, and said $MI_1I_2S$ transistor including a source, a drain and a gate, said source connected to said drain of said second transistor, said gate connected to said gate line and said drain connected to said read-out line.

5. A dynamic storage element according to claim 4, wherein said first, second and third transistors are each MOS transistors.

6. A dynamic storage element according to claim 4, wherein said first and second transistors are MOS transistors and said third transistor is a MNOS transistor.

7. A dynamic storage element constructed as a dynamic shift register, comprising a shift register input; a shift register output; at least two inverters each having an input and an output and each including at least one field effect transistor having a gate serving as said input and another terminal serving as said output; a transistor connected between said output of a first of said inverters and said input of a second of said inverters, said input of said first inverter constituting said shift register input; an output transistor connected between said output of said second inverter and said output of said shift register; a gate line; and a pair of $MI_1I_2S$ storage transistors, each of said storage transistors provided for a respective inverter and including a source, a drain and a gate, said source connected to said output of the respective inverter, said drain connected to receive a potential, and said gate connected to said gate line.

8. A dynamic storage element according to claim 7, wherein said $MI_1I_2S$ transistors are MNOS transistors and the other said transistors are MOS field effect transistors.

9. A process for the operation of a dynamic storage element of the type in which two transistors are interconnected between a word line, a gate line and a bit line, each of the transistors having a source-drain path and a gate, the source-drain paths of said transistors connected in series between the bit line and the word line, the junction of the two transistors connected by way of a capacitor to a reference potential, the gate of one of the transistors connected to the word line, and the other transistor being a $MI_1I_2S$ storage transistor having its gate connected to the gate line, said process comprising the steps of: applying a potential to the word line and a potential to the gate line, the potentials selected such that the start voltage of the $MI_1I_2S$ storage transistor is shifted or not shifted in dependence upon the nature of the stored data when data is written into the storage element, and applying a first read-out potential to the word line and a second read-out potential to the gate line, the read-out potentials selected such that the capacitor remains uncharged in response to a high start voltage of the $MI_1I_2S$ storage transistor and is charged at a low start voltage of the $MI_1I_2S$ transistor.

10. The process of claim 9, where the $MI_1I_2S$ transistor is a p-channel transistor, and further defined in that the potentials applied during writing and reading are negative potentials.

11. The process according to claim 9, in which the $MI_1I_2S$ storage transistor is a n-channel transistor, and further defined in that the potentials applied for write-in and read-out operations are positive potentials.

12. The process according to claim 9, comprising the step of connecting the gate line to ground potential to prevent operation of the $MI_1I_2S$ storage transistor.

13. The process according to claim 9, comprising the steps of storing two different itmes of data in respective ones of the transistors.

14. A process for the operation of a dynamic storage element which comprises a read-out line, a bit line, a gate line and four storage transistors, one of which is a $MI_1I_2S$ storage transistor, each of said transistors including a drain, a source and a gate with the source of a first of the transistors connected to the drain of a second of the transistors, the source of the second transistor connected to a reference potential, the drain of the second transistor connected to the bit line, the source of a third transistor connected to the gate of the second transistor, the drain of the third transistor connected to the bit line, the gates of the first and third transistors constituting at least one word line, and wherein the source of the $MI_1I_2S$ transistor is connected to the drain of the second transistor and to the source of the first transistor and the gate of the $MI_1I_2S$ transistor is connected to the gate line and the drain of the $MI_1I_2S$ transistor is connected to the read-out line, comprising the steps of applying a voltage pulse to the gate line and to the read-out line for write-in, and applying a read-out voltage to the gate line and connecting the read-out line to ground for read-out of information.

15. The process of claim 14, further defined as applying a negative voltage pulse to the gate line and to the read-out line during write-in and applying a negative read-out voltage to the gate line when the $MI_1I_2S$ transistor is a p-channel MNOS transistor.

16. The process of claim 14, further defined by applying a positive voltage pulse to the gate line and to the read-out line during write-in and applying a positive read-out voltage to the gate line for read-out when the $MI_1I_2S$ storage transistor is a n-channel MNOS transistor.

17. The process according to claim 14, comprising the step of storing two different items of data by storing one item of data in the $MI_1I_2S$ storage transistor and the other item of data in the other three transistors which constitute a storage element.

18. A process for operating a dynamic shift register which comprises a shift register input, a shift register output, at least two inverters each having an input and an output, a transistor connected between the output of a first of the inverters and the input of a second of the inverters, the input of the first inverter constituting said shift register input, an output transistor connected between the output of the second inverter and the output of said shift register, and the pair of $MI_1I_2S$ storage transistors, each of the $MI_1I_2S$ storage transistors provided for a respective inverter and each including a source, a drain and a gate, the source connected to the output of the respective inverter, the drain connected to receive a potential at a potential control line, a gate line and the gate connected to the gate line, the process comprising the steps of applying a pulse to the control line and to the gate line to shift data from an inverter into its respective $MI_1I_2S$ storage transistor and applying a read-out voltage to the gate line and another control potential to the control line to read-out data from the $MI_1I_2S$ storage transistors.

19. The process of claim 18, further defined by the step of applying a negative voltage pulse to the control line and to the gate line to shift data to the $MI_1I_2S$ storage transistors and applying a positive read-out voltage to the gate line and to the control line when p-n channel MNOS transistors are used for the $MI_1I_2S$ storage transistors.

20. The process of claim 18, further defined by applying a positive voltage pulse to the control line and to the gate line to shift data from an inverter to its respective $MI_1I_2S$ storage transistor and applying a negative read-out voltage to the gate line and a negative voltage to the control line to read-out data from the $MI_1I_2S$ storage transistors when n-channel MNOS storage transistors are employed for the $MI_1I_2S$ transistors.

21. The process of claim 18, comprising the step of storing two different items of data at the same time by storing one item of data in an inverter and the other item of data in the accodiated $MI_1I_2S$ storage transistor.

22. A dynamic storage element comprising:
a voltage supply line, first and second bit lines, a gate line and a word line;
a pair of first transistors each having a gate, a source and a drain and interconnected as a flip-flop;
a pair of second transistors each being a $MI_1I_2S$ storage transistors and each having a gate, a drain and a source, the source-drain paths of said second transistors connected in series with respective source-drain paths of said first transistors between said voltage supply line and a reference potential; and a pair of third transistors each having a gate connected to said word line, a source and a drain, the source-drain path of a third transistor connected between a respective bit line and a respective junction of a serially connected first and second transistor.

23. The dynamic storage element of claim 22, wherein said first and third transistors are MOS field effect transistors.

24. The dynamic storage element of claim 22, wherein said second transistors are MNOS storage transistors comprising a $SiO_2$ layer and a $Si_3N_4$ layer.

25. The dynamic storage element of claim 24, wherein said $SiO_2$ layer has a thickness in the range of 1 to 3 nm and the $Si_3O_4$ layer has a thickness in the range of 30 to 60 nm.

26. A process for operating a dynamic four transistor storage element which is connected to a voltage supply line, first and second bit lines, a gate line and a word line and which comprises a pair of first transistors each having a gate, a source and a drain and interconnected as a flip-flop, a pair of second transistors, each of the second transistors being a $MI_1I_2S$ storage transistor and each having a gate, a drain and a source, the source-drain paths of the second transistors connected in series with respective source-drain paths of the first transistors between the voltage supply line a reference potential, and a pair of third transistors each having a gate connected to the word line, a source and a drain, the source-drain path of a third transistor connected between a respective bit line and a respective junction of a serially connected first and second transistor, the process comprising the steps of:

applying a high voltage pulse to the voltage supply line and to the gate line of a magnitude such that the start voltage of the $MI_1I_2S$ transistor which is connected in series with a conductive one of the flip-flop first transistors is displaced toward a higher value and that the start voltage of the other $MI_1I_2S$ transistor is not displaced for restoring data from the flip-flop transistors into the $MI_1I_2S$ storage transistors; and applying the supply voltage to the supply voltage line and a read-out voltage having a value corresponding approximately to the arithmetic mean of the two start voltages of the $MI_1I_2S$ storage transistors to the gate line for restoring the data from the $MI_1I_2S$ storage transistors into the flip-flop first transistors.

27. The process of claim 26, wherein the step of applying a high voltage pulse to the voltage supply line and to the gate line is further defined by applying a negative voltage pulse to those lines when the $MI_1I_2S$ transistors are p-channel transistors.

28. The process of claim 26, wherein the step of applying a high voltage pulse to the voltage supply line and to the gate line is further defined as applying a positive voltage pulse to those lines when the $MI_1I_2S$ transistors are n-channel transistors.

* * * * *